(12) United States Patent
Gammaitoni et al.

(10) Patent No.: US 8,174,167 B2
(45) Date of Patent: May 8, 2012

(54) BISTABLE PIEZOELECTRIC GENERATOR

(76) Inventors: Luca Gammaitoni, Perugia (IT); Helios Vocca, Perugia (IT); Paolo Amico, Perugia (IT)

( * ) Notice: Subject to any disclaimer, the term of this patent is extended or adjusted under 35 U.S.C. 154(b) by 370 days.

(21) Appl. No.: 12/541,815

(22) Filed: Aug. 14, 2009

(65) Prior Publication Data
US 2010/0207491 A1    Aug. 19, 2010

(51) Int. Cl.
*H01L 41/113*    (2006.01)
(52) U.S. Cl. ......... 310/339; 310/319; 310/329; 310/330
(58) Field of Classification Search .................. 310/319, 310/329, 330, 339
See application file for complete search history.

(56) References Cited

U.S. PATENT DOCUMENTS

| | | | | |
|---|---|---|---|---|
| 3,456,134 A | * | 7/1969 | Ko | 607/35 |
| 4,510,484 A | * | 4/1985 | Snyder | 340/438 |
| 7,667,376 B2 | * | 2/2010 | Schmidt | 310/339 |
| 2004/0055293 A1 | * | 3/2004 | Pistor | 60/527 |
| 2006/0202592 A1 | * | 9/2006 | Ruggeri et al. | 310/349 |
| 2008/0092354 A1 | * | 4/2008 | Clingman et al. | 29/25.35 |
| 2008/0100182 A1 | * | 5/2008 | Chang et al. | 310/339 |

FOREIGN PATENT DOCUMENTS
WO   WO/2005/062443 A1 *  7/2005
* cited by examiner

*Primary Examiner* — Thomas Dougherty

(57) ABSTRACT

The invention concerns a bistable piezoelectric generator comprising at least one element in piezoelectric material, with at least one end fixed at a base and having the other end with a mass capable of making oscillations between two distinct positions, respectively a first equilibrium position and a second position opposed to the first, said at least one element being subjected to nonlinear bistable oscillations, the kinetic energy of such bistable oscillations being converted into electric energy and transformed through an electronic circuit in a suitable form for the powering of electric and/or electronic devices.

10 Claims, 8 Drawing Sheets

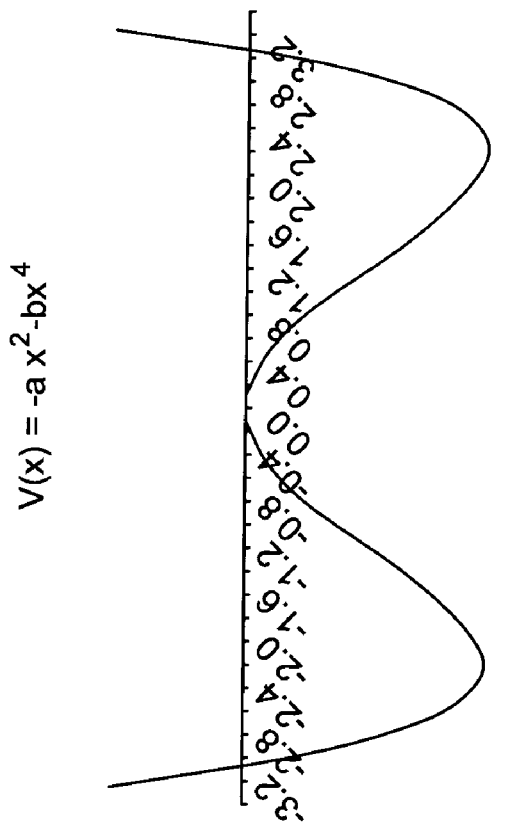
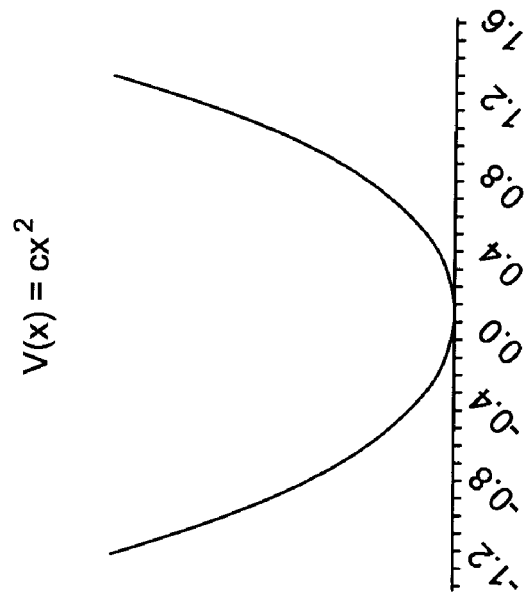
FIG. 1

BISTABLE PIEZOELECTRIC GENERATOR

CROSS-REFERENCE TO RELATED APPLICATION

This application claims the benefit of the priority filing date in PCT/IT2008/000081 referenced in WIPO Publication WO/2008/099437. The earliest priority date claimed is Feb. 15, 2007.

FEDERALLY SPONSORED RESEARCH

None

SEQUENCE LISTING OR PROGRAM

None

STATEMENT REGARDING COPYRIGHTED MATERIAL

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

The present invention concerns a bistable piezoelectric generator. More specifically, the invention concerns an electric power generator based on the conversion of mechanical energy into electric energy through the bistable oscillations of elements of piezoelectric material.

It is well known that piezoelectric generators are commonly used in a number of fields of human activity in order to provide electric currents by means of mechanical energy conversion. However, the limited quantity of electric energy produced by conventional generators tends to limit their use. In recent years a number of studies have been proposed wherein the power generated by piezoelectric material could be employed to power mini and micro portable electronic devices. Such devices require just a limited amount of electric power during their operation, allowing the use of power micro-generators as an alternative to traditional batteries. In this respect, there have been proposed power micro-generators that can be connected to devices or structures undergoing some kind of movement (table vibrations, benches or mechanical structures vibrations, oscillatory motions made by machines or cars, human or animal motion, natural atmospheric or seismic event activated motion). Such devices convert the energy present in the environment into electric energy that can be used to power electronic micro devices.

In the past, a number of devices aimed at the same purposes of the present invention have been proposed. Examples can be found in the following U.S. patents.: U.S. Pat. No. 2,081,862 by Alfred L. W. Williams; U.S. Pat. No. 4,467,236 by Henry H. Kolm and Eric A. Kolm; U.S. Pat. No. 4,510,484 by D. S. Snyder; U.S. Pat. No. 4,504,761 by C G. Triplett; 5,512,795 by Michael Y. Epstein et al; U.S. Pat. No. 6,407,484 by John R. Oliver et al; U.S. Pat. No. 6,438,193 by W. H. Ko e; U.S. Pat. No. 7057330 by Steven A. Buhler et al.

The main limitation of the existing devices, however, is their intrinsic inability to exploit the whole spectrum of energy available. This is due to the fact that their functioning principle unavoidably selects just a small portion of the whole energy spectrum. The kinetic energy freely available in the environment (natural events, machine, animal or human related motion) is usually spread in a wide spectrum of frequencies ranging from a few Hz to a few KHz. The existing generators are based on linear oscillations of mechanical piezoelectric structures. Such structures are capable of exploiting the environment's energy only in a narrow frequency band close to their resonant frequency because, for geometrical reasons, they oscillate mainly at their resonant frequency.

On the other hand, a bistable oscillator is a nonlinear oscillating system that, unlike a linear system, admits two equilibrium positions (see graph in FIG. 1). For the linear oscillator, the oscillations are represented by periodic movements centered around the single equilibrium point. For the nonlinear bistable oscillator, the oscillations are represented by a more complex motion. In addition to the two simple oscillations centered around each local equilibrium point, there are also wide movements that represents the passage from one equilibrium point to the other.

Based on these premises, the Applicant has realized a Bistable piezoelectric generator that is capable of overcoming the above mentioned limitations of linear piezoelectric generators.

SUMMARY

The solution proposed in the present invention provides an electric power generator based on the conversion of mechanical energy into electric energy obtained from the bistable motion of elements of piezoelectric material. The converter, as in the invention, can be shaped in a number of different geometrical configurations, all based on the same conceptual principle: i.e. the bistable oscillations of a dynamical system.

The specific object of the present invention is a bistable piezoelectric generator comprising at least one element in piezoelectric material, with at least one end fixed at a base and having the other end with a mass capable of making oscillations between two distinct positions, respectively a first equilibrium position and a second position opposed to the first. The at least one element being subjected to nonlinear bistable oscillations, the kinetic energy of such bistable oscillations being converted into electric energy and transformed through an electronic circuit in a suitable form for the powering of electric and/or electronic devices. Possibly, according to the invention, said piezoelectric element is at least one rod or bar whose shape is approximately a parallelepiped.

In the preferred embodiment of the bistable piezoelectric generator, the mass is fixed at one end of said element of piezoelectric material opposed to the end fixed at the base. According to the invention, the generator can be realized with a plurality of piezoelectric elements, all with one end fixed at the same or separate bases, and each of them with a separate or the same mass fixed at the other end. In this case the electric potential differences are collected and transformed by an electronic circuit in a suitable form for the powering of electric and/or electronic devices.

In an alternative embodiment of the bistable piezoelectric generator, said at least one piezoelectric element may have both ends fixed at its own base, the mass positioned on the piezoelectric element in a position approximately centered on the element, between the two ends. According to the invention, the generator can be realized with a plurality of piezoelectric elements, all with both ends fixed, each at its own base, the mass positioned on the piezoelectric element in a position approximately centered on the element between the two ends.

In a further alternative embodiment of the bistable piezoelectric generator, said at least one piezoelectric element may have one end fixed at a base and a permanent magnet at the other end, a fixed structure present, that at due distance from the said magnet, holds in place another permanent magnet or an electro-magnet, with inverted magnetic polarities respective to said permanent magnet at the end of the piezoelectric element. According to the invention, the generator can be realized with a plurality of piezoelectric elements, all with one end fixed at a base and having at the other end a permanent magnet.

Specifically, according to the invention, the generator can be realized with a plurality of piezoelectric elements, oriented in an ordered or random manner and electrically connected in a series or in parallel with the nearby element. According to the invention, said bistable piezoelectric generator is based on the exploitation of the bistable oscillations of the dynamical system composed of the piezoelectric elements.

FIGURES

FIG. 1 shows two graphs of the potential energy function V(x), evidencing the difference between a first non-linear oscillator ($V(x)=cx^2$) and a second nonlinear (nonlinear) oscillator ($V(x)=-ax^2+bx^4$);

DESCRIPTION

By looking at the figures of the attached drawings, it is evident how the electric power generator can assume different geometric configurations all based on the very same invention principle of exploitation of the bistable oscillations of a dynamical system.

Figure 2:
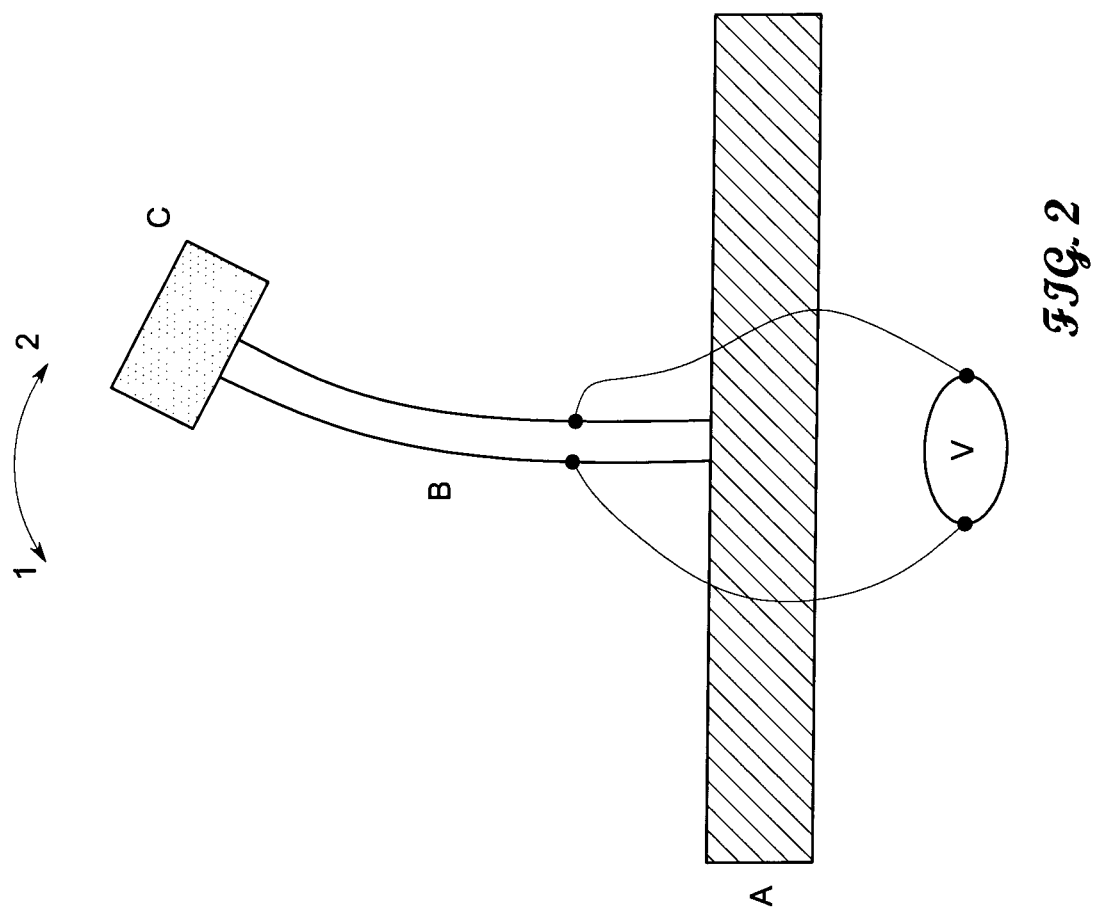
FIG. 2 shows a possible embodiment of the bistable piezoelectric generator according to the invention.

Referring to FIG. 2, a tiny rod B whose shape is approximately that of a parallelepiped, made of piezoelectric material, is held in place in a fixed base at one end A, while the other end is free with a mass C attached which slightly bends the rod with its weight. Vibrations and/or oscillations induced in the base A produce the oscillation of the mass C attached to the free end of the rod B, making it widely move between one equilibrium position 1 and the other opposite equilibrium position 2 in a truly bistable motion.

The repeated bending of the piezoelectric rod B produces at its terminal an electric potential difference V, which can be converted into an electricity flux (current) by using standard electronics [not discussed here as it is not specific to the invention]. The electric current thus generated can be usefully employed for powering electronic devices.

Figure 3:
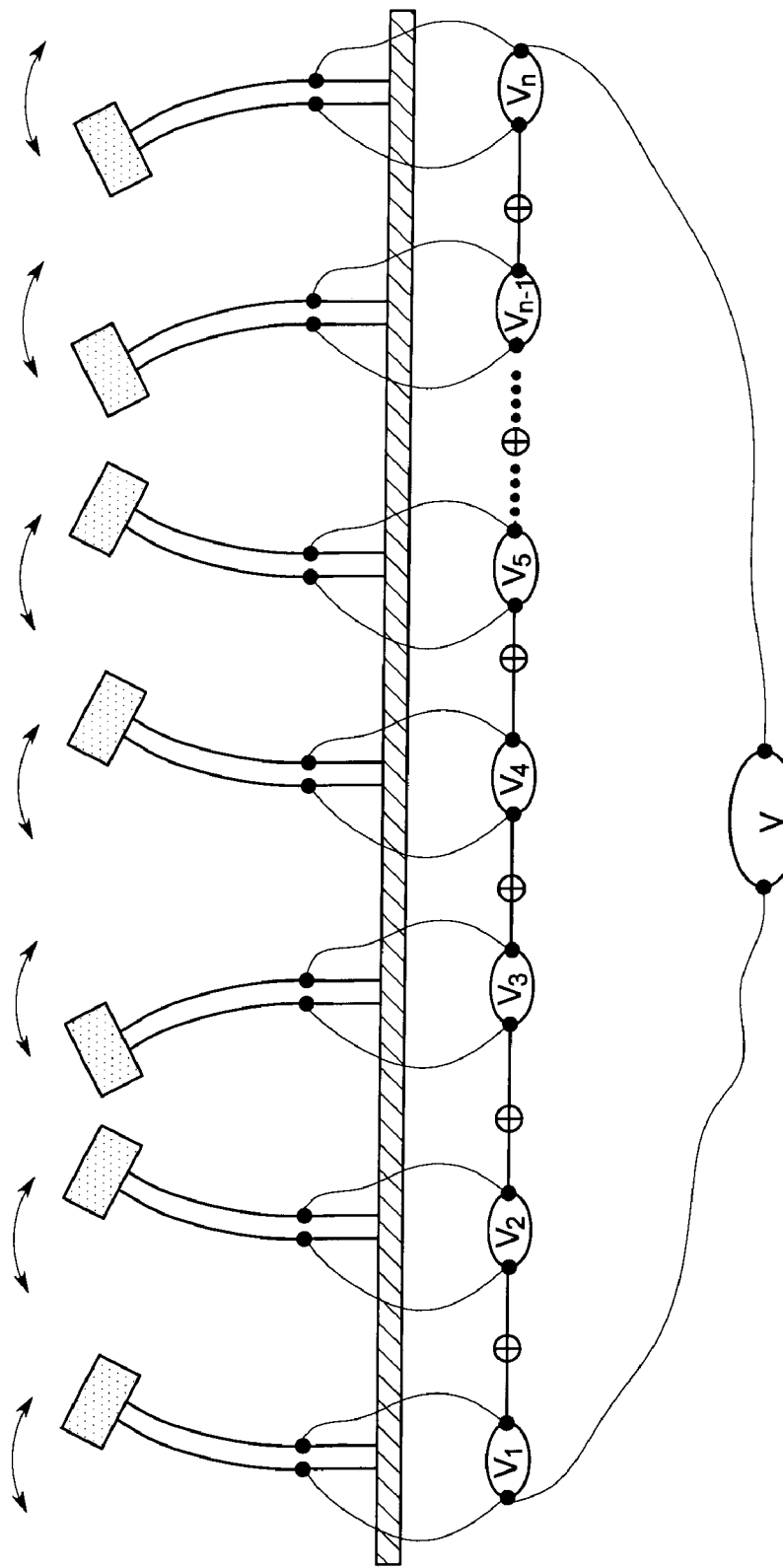
FIG. 3 shows a second possible embodiment of the bistable piezoelectric generator.

Referring to FIG. 3, a possible alternative embodiment of the bistable piezoelectric generator is shown wherein a series of tiny rods B, whose shapes are each approximately that of a parallelepiped, made of piezoelectric material, are placed close to each other and are held in place in a fixed base A at one end. The other end of each rod is free with a mass C attached to each that slightly bends the rods B with its weight. Vibrations and/or oscillations induced in the base A produce the oscillation of the masses C attached to the free ends of the rods B, making them widely move between one equilibrium position 1 and the other opposite equilibrium position 2 in a truly bistable motion. The repeated bending of the piezoelectric rods B produces at their terminal an electric potential difference $V_1, V_2, \ldots V_n$, which can be converted into an electricity flux (current) by using standard electronics [not discussed here as it is not specific to the invention]. The electric current thus generated can be usefully employed for powering electronic devices.

Figure 4:
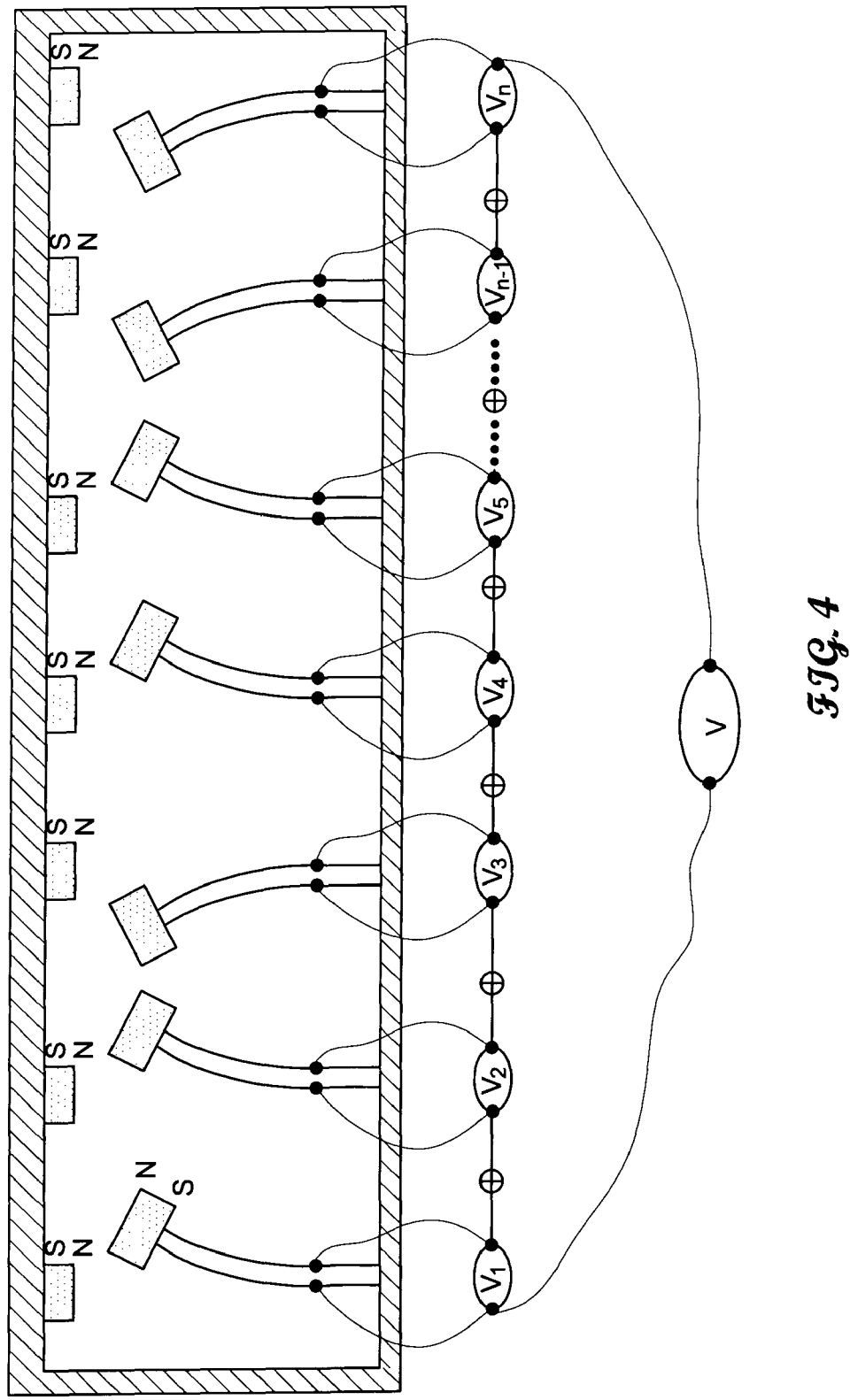
FIG. 4 shows a third possible embodiment of the bistable piezoelectric generator.

Referring to FIG. 4, a third possible embodiment of the bistable piezoelectric generator, according to the invention, wherein a series of tiny rods B, whose shapes are each approximately that of a parallelepiped, made of piezoelectric material, are placed close to each other and are held in place in a fixed base A at one end. The other end of each rods is free and has a permanent magnet D (NS) attached, being present a fixed structure F that, at due distance from said magnets D, holds in place other permanent magnets E or electro-magnets, with inverted magnetic polarities (SN) respective to said permanent magnets D at the end of the piezoelectric element on every rod.

The whole of these magnets/electromagnets E is attached to the fixed structure F that is fixed rigidly to the base A. The force between the magnets D (or between these and the electromagnets E) induces the partial bending of each rod B. Vibrations and/or oscillations induced in the base A produce the oscillation of the masses (in this case the magnets D) attached to the free end of the rod B, making them widely move between one equilibrium position 1 and the other opposite equilibrium position 2 in a truly bistable motion. The repeated bending of the piezoelectric rods B produces at their terminal an electric potential difference $V_1, V_2, \ldots V_n$, which can be converted into an electricity flux (current) by using standard electronics [not discussed here as it is not specific to the invention]. The electric current thus generated can be usefully employed for powering electronic devices.

Figure 5:
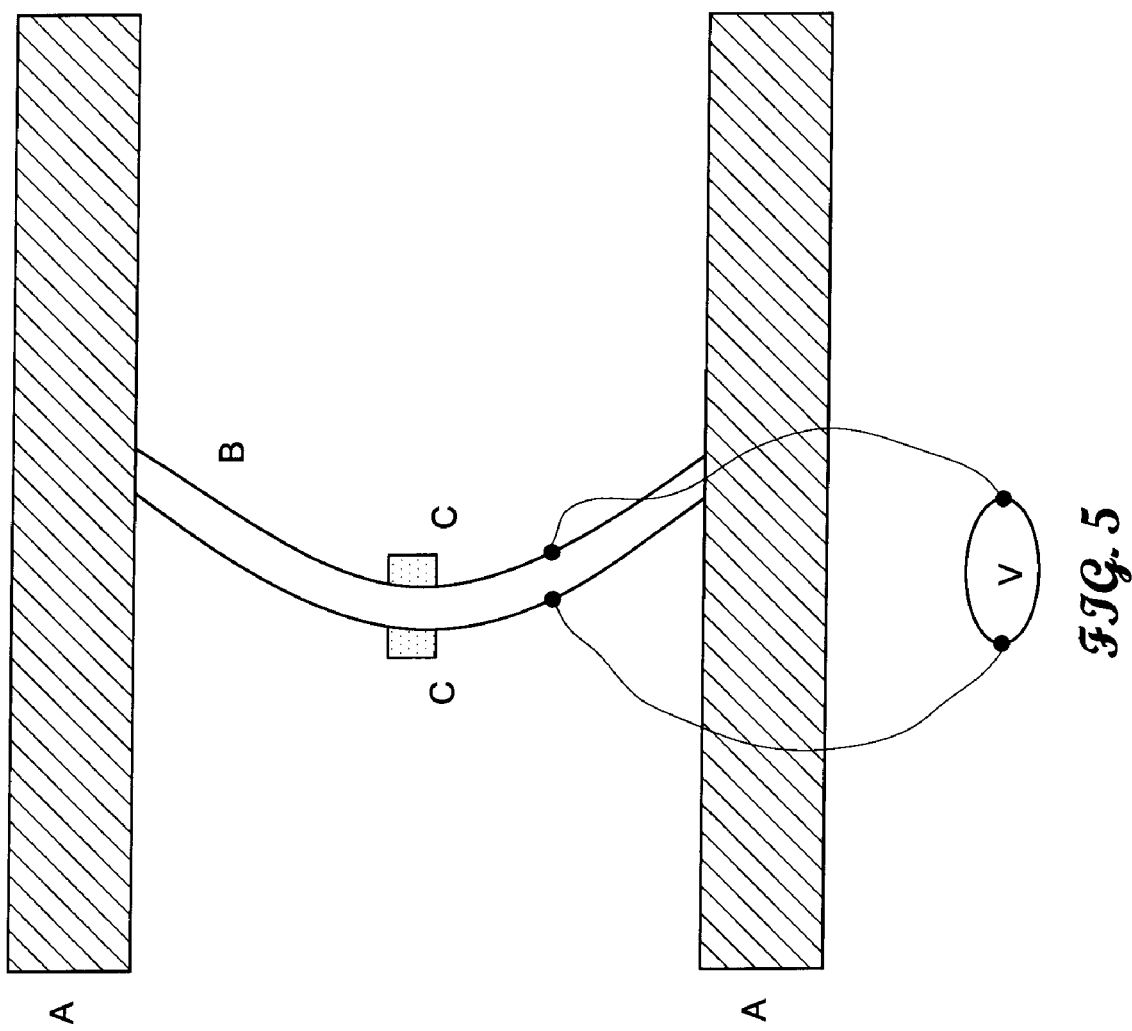
FIG. 5 shows a fourth possible embodiment of the bistable piezoelectric generator.

Referring to FIG. 5, a fourth possible embodiment of the bistable piezoelectric generator is shown, wherein a tiny rod B, whose shape is approximately that of a parallelepiped, made of piezoelectric material, has each end connected to a rigid and fixed structure A, A' in such a way that the rod is slightly bended on one side. Approximately at the middle of the rod, between the two ends, a heavy mass C is attached. Vibrations and/or oscillations induced in the structure produce the oscillation of the mass C fixed at the middle of the rod B, making it widely move between one equilibrium position and the other opposite equilibrium position 2 in a truly bistable motion. The repeated bending of the piezoelectric rod B produces at its terminal an electric potential difference V, which can be converted into an electricity flux (current) by using standard electronics [not discussed here as it is not specific to the invention]. The electric current thus generated can be usefully employed for powering electronic devices. This realization of the bistable piezoelectric generator can be made with an arbitrary number of piezoelectric rods B connected each other in a way analogous to that of FIG. 3.

The fundamentals of the bistable piezoelectric generator, according to the invention, is the principle of conversion of mechanical energy into electric energy through the piezoelectric effect. The current produced at the ends of the piezoelectric rods B, under fixed conditions, is greater the more the rod bends under the motion of the structure to which the rods are connected. The current generated by the bistable piezoelectric generator, according to the invention, is thus a function of the motion of the rod B that in turn is a function of the motion of the structure A. Under the same piezoelectric conversion factor, between two different piezoelectric generators, the generator that is capable of responding with wider motion relative to the motion of the structure A where it is fixed will be more efficient. Such a capability-to-respond to a certain motion is quantified in the concept of response function.

The response function of a mechanical structure, like the piezoelectric rod B, determines what fraction of the energy provided by the environment is transferred to the mechanical structure. Standard piezoelectric generators have a response function of a resonant type, i.e. the maximum of the transferred energy is realized for a unique, specific frequency called "resonant frequency" that is typical of each structure. Far from this frequency, the amount of energy transferred to the structure decreases rapidly and approximates to zero for frequencies of the order of two or three (or one half, one third) of the resonant frequency.

Figure 6:
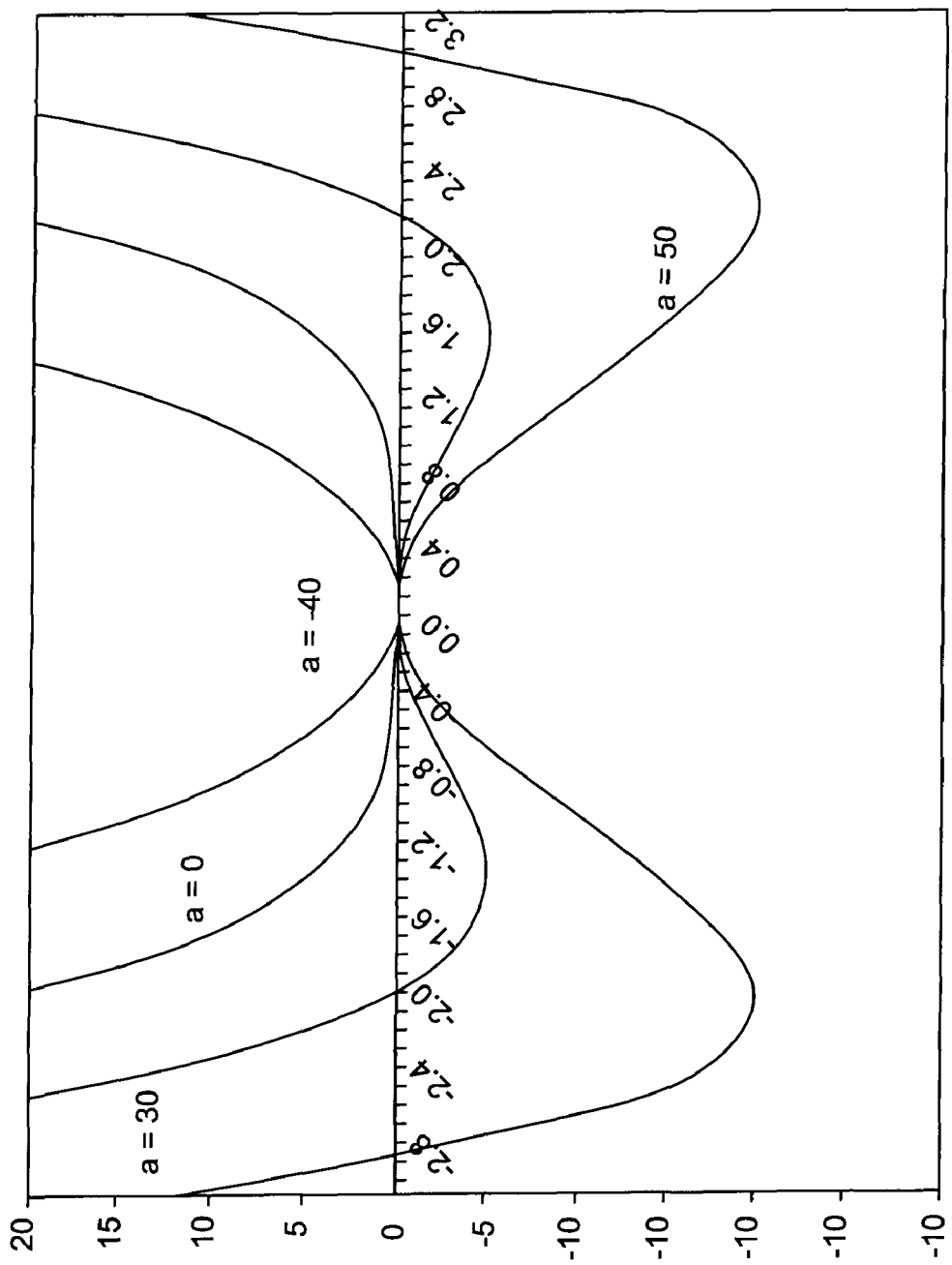
FIG. 6 shows a graph of the nonlinear potential $V(x)=-ax'+bx^4$ for different values of the parameter a, with fixed b.

On the contrary, the bistable piezoelectric generator, according to the present invention, shows a response function of a NON-resonant type. In other words, for this response function, a unique resonance frequency does not exist as in the linear oscillators, but the dynamics is instead characterized by a non-linear response function as in the bistable oscillator in the piezoelectric generator of the invention. To better evidence the advantage of a nonlinear (bistable) response compared to a linear (resonant) response the mathematical function called Spectral Density Function $S(f)$ must be considered. The function $S(f)$ describes the behavior of a generic dynamic system under the effect of an external force. If it can be imagined that the external force is made by environmental vibrations that give mechanical energy to the piezoelectric generator, then the efficiency of the generator can be measured by the area under the curve of $S(f)$ as a function of f. Such an area is proportional to the electric power produced by the piezoelectric generator. Consider a dynamic system made by an oscillator with a bistable potential energy function (see FIG. 1) as defined by equation $V(x) = -ax^2 + bx^4$. This potential is characterized by two parameters, a and b, whose value can be varied at will. By fixing the value b and changing the value a (see FIG. 6), one can go from the monostable potential configuration (quasi-linear, resonant case) for $a<0$ to the bistable potential configuration (non-linear, NON resonant case) for $a>0$.

Figure 7:
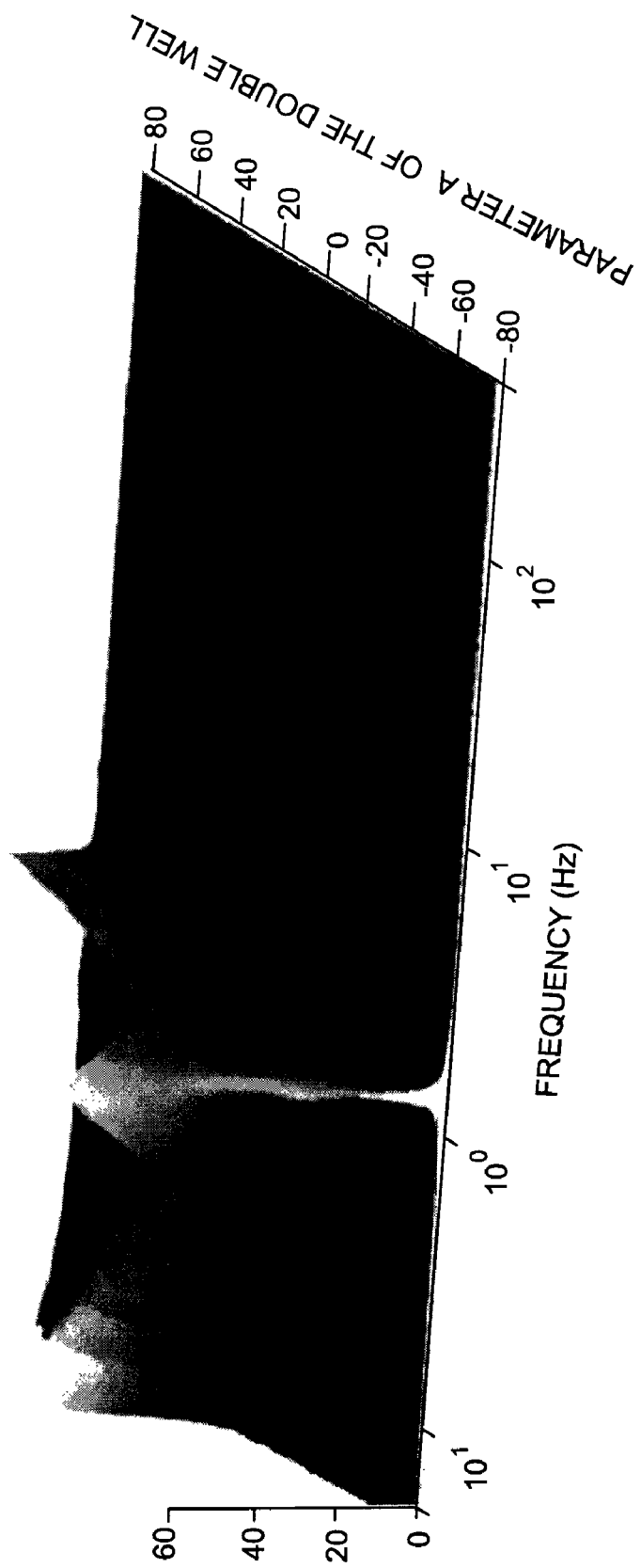
FIG. 7 shows a graph of the spectral density $S\phi$ as a function of the parameter a, with fixed b.
Figure 8:
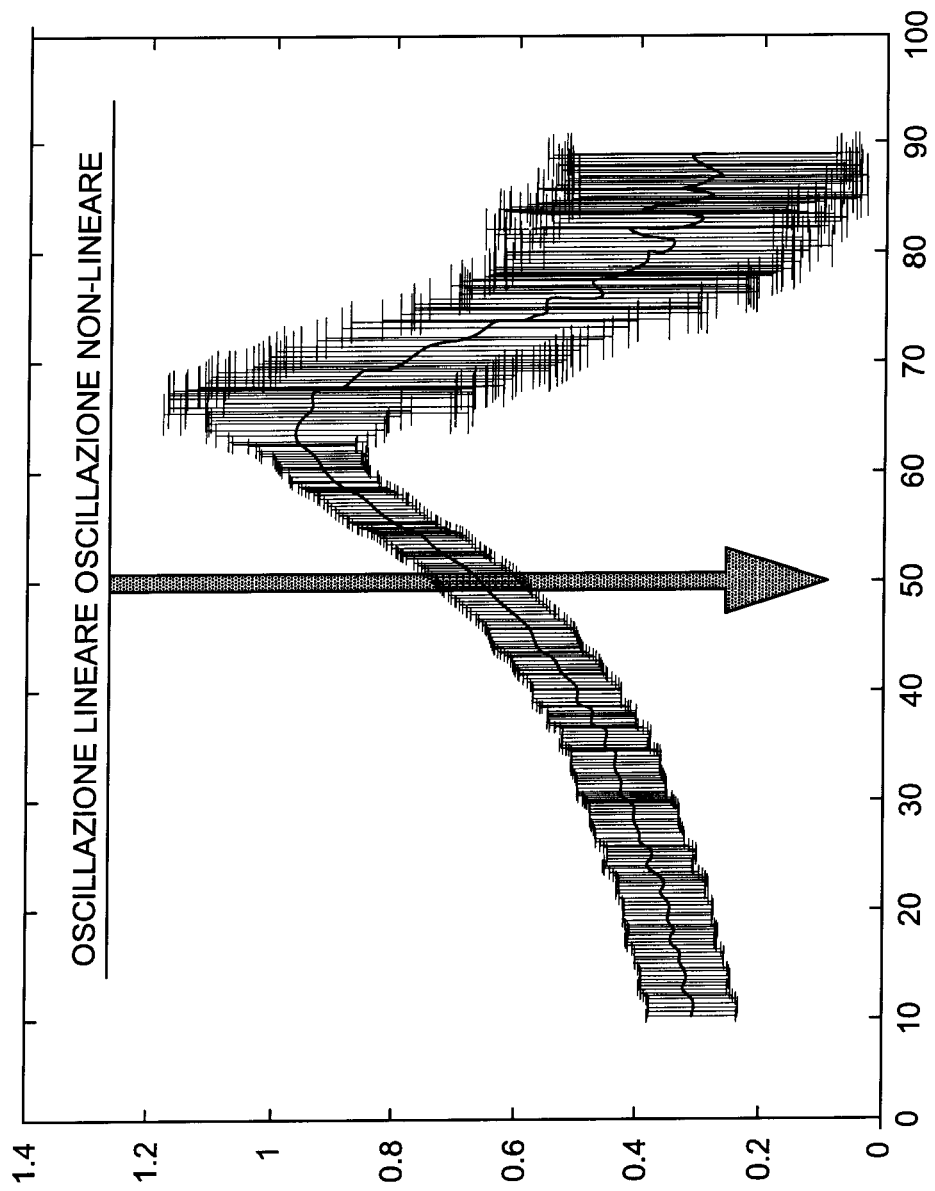
FIG. 8 shows a graph of the power provided by the piezoelectric oscillator as a function of the parameter a, with fixed b.

Referring to FIG. 7 the function $S(f)$ as a function of the frequency f for different values of the parameter a is shown. For every fixed value a we have a different function $S(f)$. The area under the curve $S(f)$ (i.e. the integral of the function $S(f)$ between 0 and +infinity) is a measure of the power obtainable. Such quantity is shown in FIG. 8, as a function of the parameter a. As is apparent, an optimal value of the parameter a exists, where the obtainable power reaches a maximum. Such an optimal value of a is in the bistable potential configuration region.

All features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, paragraph 6. In particular, the use of "step of" in the claims herein is not intended to invoke the provisions of 35 U.S.C. §112, paragraph 6.

Although preferred embodiments of the present invention have been shown and described, various modifications and substitutions may be made thereto without departing from the spirit and scope of the invention. Accordingly, it is to be understood that the present invention has been described by way of illustration and not limitation.

What is claimed is:

1. A piezoelectric bistable generator containing at least one element of piezoelectric material, with at least one end fixed at a base and having the other end with a mass capable of making oscillations between two distinct positions, respectively a first equilibrium position and a second position opposed to the first, said at least one element being subjected to nonlinear bistable oscillations, the kinetic energy of such bistable oscillations being converted into electric energy and transformed through an electronic circuit in a suitable form for the powering of electric and/or electronic devices.

2. A piezoelectric bistable generator according to claim 1, characterized by the fact that the at least one element is of piezoelectric material and is a rod or a bar whose shape is approximately a parallelepiped.

3. A piezoelectric bistable generator according to claim 1, characterized by the fact that said mass is attached at one free end of said element in piezoelectric material as opposed to the other end fixed at the base.

4. A piezoelectric bistable generator according to claim 3, characterized by a plurality of elements in piezoelectric material, all of them having one end fixed to the same or different base and each with a mass attached at the other free end, the various electrical potential differences of every element being collected and transformed by an electronic circuit in a suitable form for the powering of electric and/or electronic devices.

5. A piezoelectric bistable generator according to claim 1, characterized by the fact that said at least one element in piezoelectric material having both ends fixed each at its own base, the mass positioned on the piezoelectric element in a position approximately centered on the element, between the two ends.

6. a piezoelectric bistable generator according to claim 5, characterized by a plurality of elements in piezoelectric material with both ends fixed each at its own base, the mass positioned on the piezoelectric element in a position approximately centered on the element, between the two ends.

7. A piezoelectric bistable generator comprising at least one element of piezoelectric material, with at least one end fixed at a base and having the other end with a mass capable of making oscillations between two distinct positions, respectively a first equilibrium position and a second position opposed to the first, said at least one element being subjected to nonlinear bistable oscillations, the kinetic energy of such bistable oscillations being converted into electric energy and transformed through an electronic circuit in a suitable form for the powering of electric and/or electronic devices, characterized by the fact that said at least one element in piezoelectric material, at one end of the piezoelectric element, opposed to the end fixed at the said base, is attached to a permanent magnet, being present a fixed structure that, at due distance from the said magnet, holds in place another permanent magnet or an electro-magnet, with inverted magnetic polarities respect to said permanent magnet at the end of the piezoelectric element.

8. A piezoelectric bistable generator according to claim 7, characterized by a plurality of elements in piezoelectric material with one permanent magnet at one end.

9. a piezoelectric bistable generator according to claim 1, characterized by a plurality of elements in piezoelectric material, oriented in ordered or random manner and electrically connected in a series or in parallel with the nearby element.

10. a piezoelectric bistable generator according to claim 1, characterized by the fact that said piezoelectric bistable generator is based on the exploitation of the bistable oscillations of the dynamic system composed of the elements in piezoelectric material.

* * * * *